United States Patent
Fairchild et al.

(10) Patent No.: US 7,274,105 B2
(45) Date of Patent: Sep. 25, 2007

(54) THERMAL CONDUCTIVE ELECTRONICS SUBSTRATE AND ASSEMBLY

(75) Inventors: M. Ray Fairchild, Kokomo, IN (US); Aleksandra Djordjevic, Kokomo, IN (US); Javier Ruiz, Noblesville, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 11/287,834

(22) Filed: Nov. 28, 2005

(65) Prior Publication Data

US 2007/0120250 A1    May 31, 2007

(51) Int. Cl.
*H01L 23/48* (2006.01)
*H01L 23/498* (2006.01)
*H05K 1/02* (2006.01)
*H05K 3/34* (2006.01)
*H05K 1/11* (2006.01)

(52) U.S. Cl. .................. 257/774; 257/E23.067; 257/712; 257/713; 257/717; 257/668; 257/778; 257/738; 257/773; 257/737; 174/52.4; 174/260; 174/255; 361/760; 439/91

(58) Field of Classification Search ........ 257/E23.067, 257/778, 737, 734, 738, 774, 773, 713, 717, 257/720, 668, 691, 698, 675; 174/52.4, 255, 174/260; 361/760; 439/91
See application file for complete search history.

(56) References Cited

U.S. PATENT DOCUMENTS 6,459,039 B1 * 10/2002 Bezama et al. ............. 174/359
6,906,425 B2 *  6/2005 Stewart et al. .............. 257/778

* cited by examiner

*Primary Examiner*—Alexander Oscar Williams
(74) *Attorney, Agent, or Firm*—Jimmy L. Funke

(57) ABSTRACT

An electronics assembly is provided including a circuit board substrate having a top surface and a bottom surface and a plurality of thermal conductive vias extending from the top surface to the bottom surface. At least one electronics package is mounted to the top surface of the substrate. A heat sink device is in thermal communication with the bottom surface of the substrate. Thermal conductive vias are in thermal communication to pass thermal energy from the at least one electronics package to the heat sink. At least some of the thermal conductive vias are formed extending from the top surface to the bottom surface of the substrate at an angle.

15 Claims, 3 Drawing Sheets

THERMAL CONDUCTIVE ELECTRONICS SUBSTRATE AND ASSEMBLY

TECHNICAL FIELD

The present invention generally relates to electronics assemblies and, more particularly, relates to an electronics mounting substrate and assembly having enhanced thermal cooling.

BACKGROUND OF THE INVENTION

Power electronics devices employ electronics packages (devices) that generally contain electrical circuitry for conducting electrical current which, in turn, generates thermal energy (i.e., heat). Automotive high-power electronics typically generate a significant amount of thermal energy during operation. Excessive heat build-up may cause reduced performance including electrical circuit failure. Thus, thermal energy must be dissipated and transferred away from the electronics to ensure proper operation of the assembly. Additionally, the power capability of the electronics package (s) and size of the electronics assembly generally depend upon the amount of heat dissipation that may be achieved.

To enhance thermal energy dissipation, some electronics assemblies employ a heat sink in thermal communication with the electronics. This may include arranging the heat sink near one side of the electronics package(s) and/or on one side of the circuit board substrate. When employing a heat sink on one side of the circuit board, thermally energy dissipation from the electronics package to the heat sink is limited by the thermal conductivity of the circuit board substrate material. As a consequence, the overall heat dissipation achieved is limited.

To further enhance the heat dissipation through a circuit board substrate, it has been proposed to employ power semiconductor devices soldered to a top conductor of an electronics substrate that utilizes the substrate as the primary thermal path to a metal heat sink. The thermal conductivity of conventional substrates, such as thick film on alumina substrates, may not be acceptable for high-powered automotive applications. One proposed solution to enhance the thermal conductivity is to employ more expensive substrate materials, such as aluminium nitride, silicon nitride, and other expensive materials, which add to the cost of the circuit board and the overall electronics assembly.

An alternative proposal to changing substrate materials is to drill or punch vias (openings) into the substrate and fill the vias with a high thermal conductivity material to form a plurality of thermal conductive vias extending through the circuit board. The thermal conductive vias are formed of a material having a higher thermal conductivity than the circuit board substrate and provide a thermal communication path from the electronics package(s) to the underlying heat sink device. In the conventional assembly, the thermal conductive vias are generally parallel to each other and extend straight through the circuit board substrate from the top surface to the bottom surface.

While the prior cooling approach employing a plurality of thermal conductive vias has achieved enhanced heat dissipation from the electronics devices, the heat dissipation path is generally limited. It is therefore desirable to provide for enhanced thermal energy dissipation through a substrate. In particular, it is desirable to provide for a cost affordable electronics assembly having enhanced dissipation of thermal energy through a circuit board substrate.

SUMMARY OF THE INVENTION

In accordance with one aspect of the present invention, an enhanced thermally conductive electronics substrate is provided that is adapted to connect to an electronics package and be cooled by a cooling medium. The substrate includes a substrate material exhibiting a first thermal conductivity. The substrate material has top and bottom surfaces and is adapted to support at least one electronics package. The substrate material also includes a plurality of thermal conductive vias extending through the substrate and exhibiting a second thermal conductivity greater than the first thermal conductivity. At least some of the plurality of thermal conductive vias are formed at an angle offset from the angle perpendicular between the top and bottom surfaces of the substrate material.

According to another aspect of the present invention, an electronics assembly is provided having an electronics substrate having a top surface and a bottom surface and a plurality of thermal conductive vias extending from the top surface to the bottom surface. The thermal conductive vias exhibit a thermal conductivity greater than the thermal conductivity of the substrate. At least one electronics package is mounted to the top surface of the substrate. The electronics package has electrical circuitry. A heat sink device is in thermal communication with the bottom surface of the substrate. At least some of the plurality of thermal conductive vias are in thermal communication to pass thermal energy from the at least one electronics package to the heat sink. At least some of the thermal conductive vias are formed extending from the top surface to the bottom surface of the substrate at an angle.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF THE PREFERRED EMBODIMENTS

Figure 1:
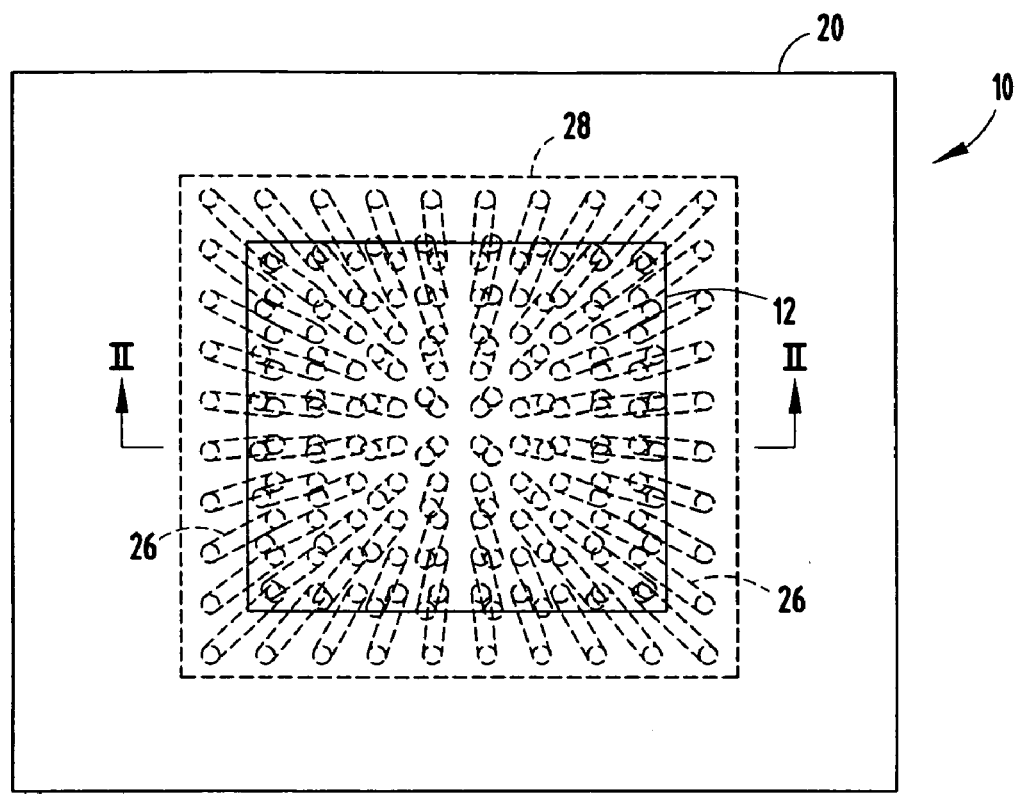
FIG. 1 is a top view of an electronics assembly employing angled thermal conductive vias according to a first embodiment of the present invention.
Figure 2:
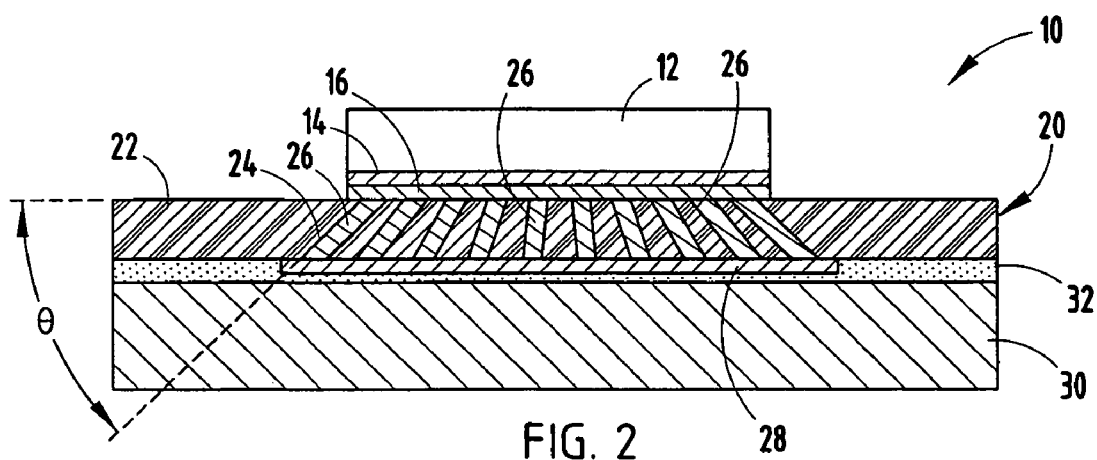
FIG. 2 is a cross-sectional view of the electronics assembly taken through line II-II of FIG. 1.

Referring to FIGS. 1 and 2, an electronics assembly 10 is generally illustrated according to a first embodiment of the present invention. The electronics assembly 10 includes a surface mountable electronics substrate 20, such as a printed circuit board, generally containing a substrate material 22 and electrical circuitry as is known in the art. The electronics assembly 10 also includes an electronics package 12 mounted onto the top surface of the substrate 20 and in thermal communication therewith. On the bottom side of the substrate 20 is a heat sink device 30 in thermal communication with the bottom side of the substrate 20. The substrate 20 is formed with a plurality of thermal conductive vias 26 located and arranged to conduct thermal energy from the electronics package 12 to heat sink 30.

The substrate 20 may include a printed circuit board, according to one embodiment, shown generally located between the heat sink device 30 and electronics package 12. The substrate 20 may include an alumina substrate, according to one embodiment. According to other embodiments, the substrate 20 may be made of a low temperature co-fired ceramic (LTCC), aluminium nitride, silicon nitride and other types of ceramic, organic materials such as FR4, a metal such as stainless steel or any other suitable material. Substrate 20 may have electrical circuitry formed on the top side surface and/or bottom side surface, as well as between laminated intermediate layers of the substrate 20. Substrate 20 is configured as a board having generally planar and parallel top and bottom surfaces, according to one embodiment.

The heat sink device 30 is shown adhered to the bottom surface of substrate 20 via a thermal conductive adhesive 32, such as a silver or ceramic filled silicone, and a thermally conductive medium 28, such as a metal pad (e.g., palladium silver). The heat sink device 30 may include any of a number of heat sink devices for exchanging thermal energy (heat) conducted thereto from the overlying substrate 20 to the ambient environment. The heat sink device 30 may include a thermal conductive material such as copper, aluminium or other metals. The heat sink device 30 may be fabricated with cooling fins to enhance the thermal heat exchange with the outside ambient environment. The heat sink device 30 may be cooled by way of convection via air flow over the outside surface. It should also be appreciated that other forms of heat sink devices such as fluid (e.g., liquid) cooling mediums may be employed with or without force fluid heat exchange.

The electronics package 12 may include any of a number of electronics packages including devices having electrical circuitry. The electronics package 12 generates thermal energy (heat) when conducting electrical current during operation. While a single electronics package 12 is shown mounted on top of substrate 20, it should be appreciated that any one or more electronics packages may be mounted onto the surface of substrate 20.

The electronics package 12 may include one or more semiconductor devices, such as transistors configured to provide controlled switching operation, operate as a diode, provide voltage regulation or perform various other functions. The electronics package 12 may be a fabricated semiconductor chip, such as a flip chip with solder bumps or wire bonded connections that are electrically and/or physically coupled to substrate 20. The electronics package 12 may also include a resistor, a capacitor, a field effect transistor (FET), isolated gate bipolar transistor (IGBT), and other electrical devices. In a high-power application, such as is common in a hybrid-electric or electric vehicle application, the electronics package 12 may include a power inverter, DC-to-DC converter or a DC-to-AC converter, according to some examples.

The electronics package 12 is shown electrically connected via a solder layer 14 or a conductive adhesive onto a thermal conductive medium 16 formed on the top surface of substrate 20. Thermal conductive medium 16 may include a copper pad, according to one example. Layer 14 may include a solder paste. Layer 14 and thermal conductive medium 16 provide thermal heat conduction from the electronics package 12 passing into substrate 20. Additionally, the connection 14 and conductive medium 16 may also operate as an electrical terminal connection and may further operate to mechanically hold the electronics package 12 onto the top surface of substrate 20.

The electronics assembly 10 employs a substrate 20 that is fabricated to include a plurality of thermal conductive vias 26 that provide for thermally enhanced heat exchange through the substrate 20 so as to allow for enhanced cooling of electronics package 12. The substrate 20 includes a substrate material 22, such as alumina (e.g., $Al_2O_3$, 96% alumina), exhibiting a first thermal conductivity (e.g., 25 W/mK). The thermal conductive vias 26 are formed in the substrate material 22 and include a higher thermal conductive material, such as silver, exhibiting a second thermal conductivity (e.g., 429 W/mK) greater than the first thermal conductivity.

According to the first embodiment, the substrate 20 employs a plurality of thermal conductive vias 26 configured in a substantially cylindrical (tubular) shape extending at an angle radially outward from the central region upon which the electronics package 12 is mounted above. The thermal conductive vias 26 may be formed in various shapes and sizes according to other embodiments. Thermal conductive vias 26 extend through the entire depth of the substrate 20. The thermal conductive vias 26 are exposed on the top and bottom surfaces of substrate 20 to allow optimal thermal conductivity through the substrate 20.

By forming the thermal conductive vias 26 in the region below the electronics package 20 and extending downward towards the bottom side of substrate 20 and further extending at an angle radially outward, an enhanced and enlarged thermal conductivity interface region is formed on the bottom surface for interfacing with the heat sink device 30. A significant amount of thermal energy (heat) passes from the bottom surface of electronics package 12 through connection 14, conductive material 16, thermal conductive vias 26 to lower thermal conductive material 28 through conductive adhesive 32 and onto the heat sink device 30. The thermal energy at the heat sink device 30 is dissipated via heat exchange with the outside environment, according to one embodiment.

According to the first embodiment, each of the thermal conductive vias 26 are formed in a tubular shape which extend through tubular shape like-size openings 24 formed in substrate 20. The openings 24 may be formed by punching, drilling, or laser machining openings through substrate 20 at an angle θ that is offset from a vector extending between the parallel planes of the top and bottom surfaces. The openings 24 are then filled with a high thermal conductive material that has a thermal conductivity greater than the thermal conductivity of the substrate material to form thermal conductive vias 26. According to one embodiment, the thermal conductive via material is silver. Other suitable thermal conductive mediums such as copper may be employed. The thermal conductive vias 26 employ a material having thermal conductivity properties that are greater in thermal conductivity than the substrate material 22 so as to enhance thermal conductivity and enhance heat exchange through the substrate 20.

In the first embodiment, the outermost thermal conductive vias 26 are shown extending down and angled outward at an angle θ up to approximately forty-five degrees (45°) relative to an axis extending through the depth of the substrate 20. The thermal conductive vias 26 formed inward of the outer perimeter have a lesser angle θ as compared to those formed near the perimeter of the package 12. By forming the thermal conductive vias 26 at an angle that projects outward below the electronics package 12, the thermal energy is spread out as it passes from the small surface area of upper thermal conductive material 16 to a larger surface area of lower thermal conductive material 28. Thermal conductive vias 26 may be formed at any of a number of angles θ according to the present invention.

Figure 3:
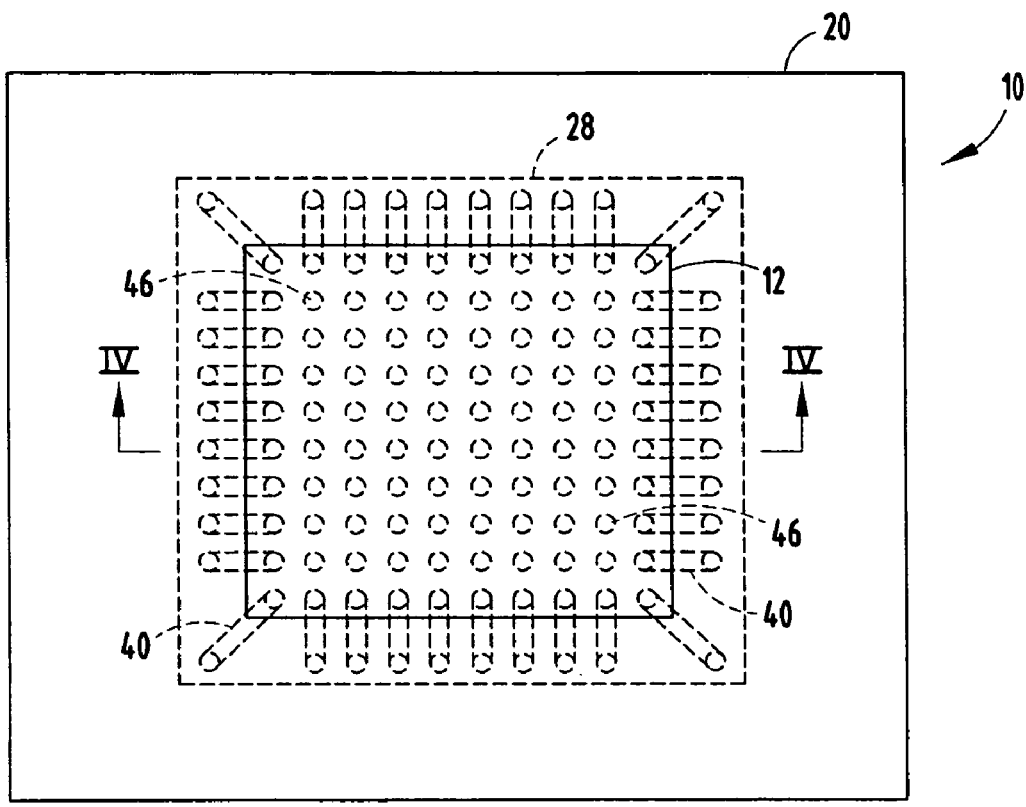
FIG. 3 is a top view of an electronics assembly employing tapered thermal conductive vias according to a second embodiment of the present invention.
Figure 4:
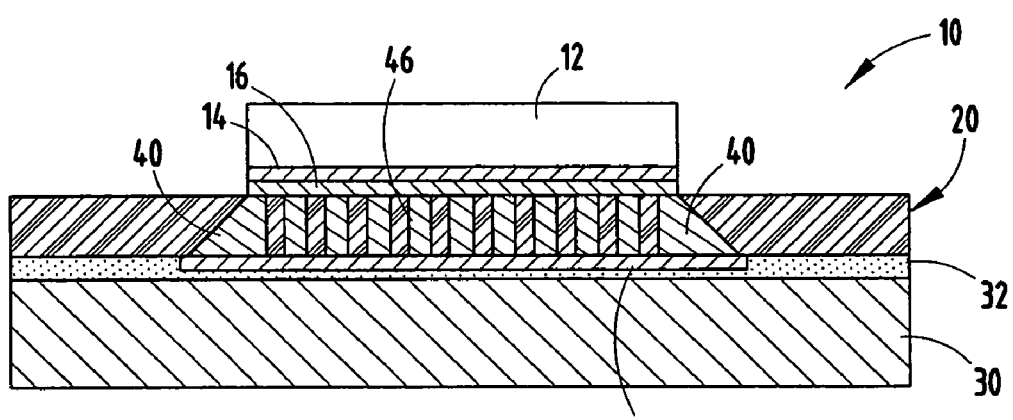
FIG. 4 is a cross-sectional view of an electronics assembly taken through line III-III of FIG. 3.

An electronics assembly 10 is also shown in FIGS. 3 and 4 according to a second embodiment of the present invention. In the second embodiment, the thermal conductive vias include a plurality of tapered vias 40 formed generally near the perimeter underlying the electronics package 12. The tapered vias 40 include an angled outside tapered surface extending radially outward from below the electronics device 12 toward the circuit board 30 at an angle θ. In the exemplary embodiment shown, a plurality of straight non-angled vias 46 are also included more centrally located below the electronics device 12. It should be appreciated that while thermal conductive vias 46 are shown extending straight from the top surface to the bottom surface of substrate 20, the thermal conductive vias 46 may likewise be angled or tapered according to other embodiments.

Figure 5:
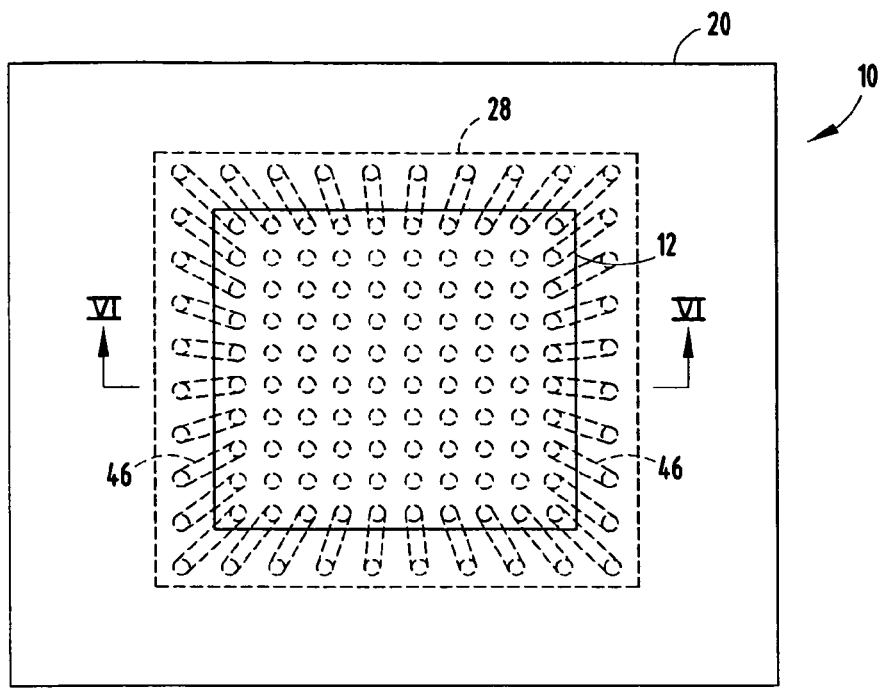
FIG. 5 is a top view of an electronics assembly employing angled and non-angled thermal conductive vias according to a third embodiment of the present invention.
Figure 6:
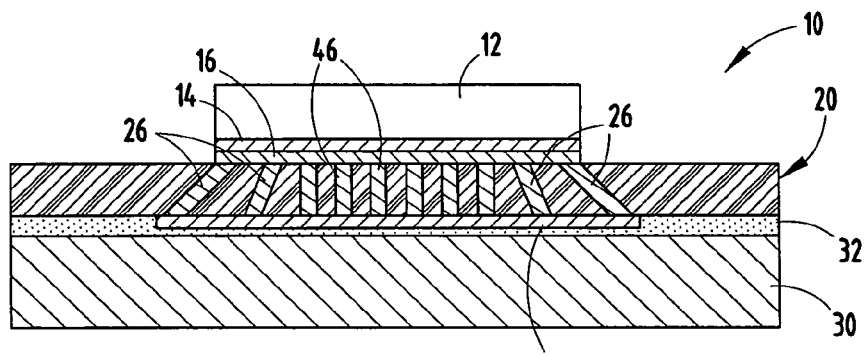
FIG. 6 is a cross-sectional view of the electronics assembly taken through line VI-VI of FIG. 5.

Referring to FIGS. 5 and 6, an electronics assembly 10 is further illustrated according to a third embodiment of the present invention. In this embodiment, a plurality of angled thermal conductive vias 26 are shown formed below electronics device 20 in a region near the perimeter of package 12. Additionally, a plurality of straight non-angled vias 46 are formed in substrate 20 extending from the top surface straight down to the bottom surface. It should be appreciated that the thermal conductive vias 46 could alternately be formed at an angle.

Figure 7:
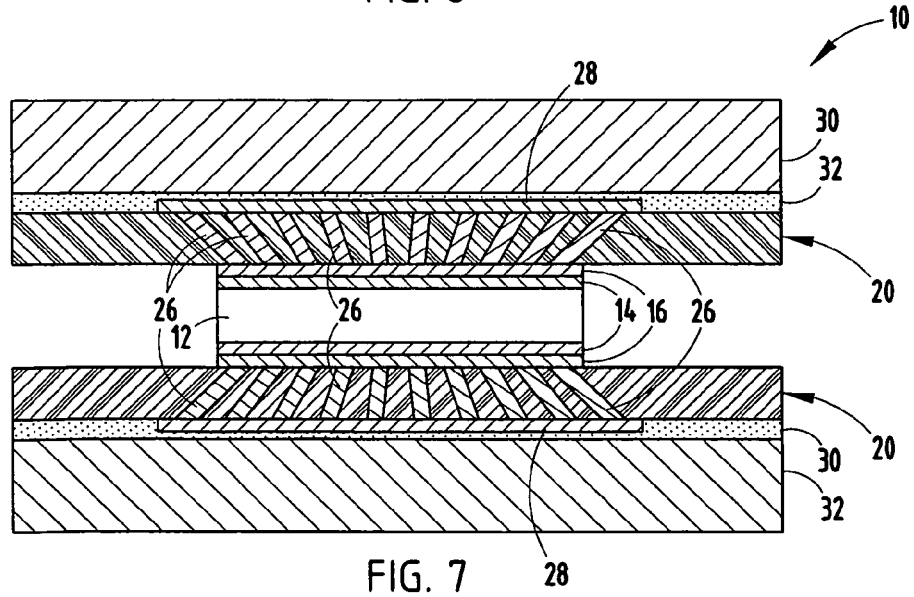
FIG. 7 is a cross-sectional view of a double-sided cooled electronics assembly according to a further embodiment.

Referring to FIG. 7, a double-sided cooled electronics assembly 10 is illustrated according to a further embodiment of the present invention. In the exemplary embodiment shown, a plurality of angled thermal conductive vias 26 are formed in substrate 20 on the bottom side of electronics package 12 as explained above in connection with the first embodiment. Additionally, the electronics assembly 10 employs an upper substrate 20 disposed on top of electronics package 12 and connected thereto via solder material 14 and conductive pad 28. The upper substrate 20 likewise includes a plurality of angled thermal conductive vias 26 extending at an angle to contact an upper thermal conductive pad 28. Additionally, a heat sink 30 is adhered via thermal conductive adhesive 32 to the top side of circuit board 20. According to this embodiment, the electronics package 12 is cooled via heat exchange passing through the angled thermal conductive vias 26 passing through both bottom and top circuit boards 20 to the bottom and top heat sinks 30, respectively.

While a plurality of angled cylindrical thermal conductive vias 26 are illustrated in FIG. 7 according to the double-sided embodiment, it should be appreciated that other angled, including tapered, thermal conductive via configurations may be employed such as those shown in any of the above embodiments for use in either the top or bottom circuit board 20. Further, it should be appreciated that the electronics package 20 may be assembled onto a substrate having angled, including tapered, thermal conductive vias extending on more than two sides, according to further embodiments.

Accordingly, the electronics assembly 10 of the present invention advantageously provides for enhanced cooling of an electronics package 12 mounted onto a substrate 20. The angled thermal conductive vias 26 or 46 advantageously enhance the thermal conductivity to exchange thermal energy (heat) from the electronics package 12 through the substrate 20 to a heat sink device for heat exchange with the ambient environment. By enhancing the heat dissipation, particularly for high-powered electronics packages, the electronics assembly 10 advantageously allows for the reduction in the number and/or size of the electronics package(s) used in the assembly 10, thereby reducing the size and cost of the overall assembly 10. Additionally, the enhanced heat dissipation achieved by employing the angled thermal conductive vias 26 or 46 in a substrate 20 according to the present invention may allow for an increase in the power output of the electronics package 12 and circuit board 20, thereby improving the overall performance of the electronics assembly 10. These and other advantages may be achieved by the novel assembly and cooling design of the present invention.

It will be understood by those who practice the invention and those skilled in the art, that various modifications and improvements may be made to the invention without departing from the spirit of the disclosed concept. The scope of protection afforded is to be determined by the claims and by the breadth of interpretation allowed by law.

The invention claimed is:

1. An electronics assembly comprising:
an electronics substrate having a top surface and a bottom surface and a plurality of thermal conductive vias extending from the top surface to the bottom surface, said thermal conductive vias exhibiting a thermal conductivity greater than a thermal conductivity of the substrate;
at least one electronics package mounted to the top surface of the substrate, said electronics package having electrical circuitry; and
a heat sink device in thermal communication with the bottom surface of the substrate, wherein at least some of the plurality of thermal conductive vias are in thermal communication with the at least one electronics package and the heat sink device to pass thermal energy from the at least one electronics package to the heat sink device, and wherein at least some of the thermal conductive vias are formed extending from the first surface to the second surface of the substrate at an angle offset from a direction extending perpendicular to the first and second surfaces.

2. The electronics assembly as defined claim 1 further comprising a thermal conductive medium disposed between the at least one electronics package and the top surface of the substrate.

3. The electronics assembly as defined in claim 1 further comprising one of a solder material and a conductive adhesive extending between the at least one electronics package and the substrate.

4. The electronics assembly as defined in claim 1 further comprising a thermal conductive medium disposed between the bottom surface of the substrate and the heat sink device.

5. The electronics assembly as defined in claim 4, wherein the thermal conductive medium comprises a thermal adhesive.

6. The electronics assembly as defined in claim 1, wherein said at least some of the plurality of thermal conductive vias are formed near a perimeter of a mounting area for receiving the electronics package.

7. The electronics assembly as defined in claim 1, wherein the plurality of thermal conductive vias are substantially cylindrical.

8. The electronics assembly as defined in claim 1, wherein said at least some of the plurality of thermal conductive vias are formed to include a tapered surface extending from the first surface to the second surface of the substrate.

9. The electronics assembly as defined in claim 1, wherein the plurality of thermal conductive vias comprise openings formed in the substrate and containing silver.

10. An electronics assembly comprising:
a circuit board comprising an electronics substrate, a top surface, a bottom surface and a plurality of thermal conductive vias extending from the top surface to the bottom surface, said thermal conductive vias exhibiting a thermal conductivity greater than a thermal conductivity of the substrate;
at least one electronics package mounted to the top surface of the substrate, said electronics package having electrical circuitry; and
a heat sink device in thermal communication with the bottom surface of the circuit board, wherein at least some of the plurality of thermal conductive vias are in thermal communication with the heat sink device to pass thermal energy from the at least one electronics package to the heat sink device, and wherein at least some of the thermal conductive vias are formed extending from the first surface to the second surface of the circuit board at an angle.

11. The electronics assembly as defined in claim 10 further comprising a thermal conductive medium disposed between the at least one electronics package and the top surface of the circuit board.

12. The electronics assembly as defined in claim 11 further comprising a thermal conductive medium disposed between the bottom surface of the circuit board and the heat sink device.

13. The electronics assembly as defined in claim 10, wherein the plurality of thermal conductive vias are substantially cylindrical.

14. The electronics assembly as defined in claim 10, wherein said at least some of the plurality of thermal conductive vias are formed to include a taper extending from the first surface to the second surface of the substrate.

15. The electronics assembly as defined in claim 10, wherein the plurality of thermal conductive vias comprise silver.

* * * * *